United States Patent [19]

Matty

[11] 3,838,353

[45] Sept. 24, 1974

[54] AMPLIFIER WITH FAILSAFE PREDERTERMINED GAIN

[75] Inventor: Thomas C. Matty, Irwin, Pa.

[73] Assignee: Westinghouse Electric Corporation, Pittsburgh, Pa.

[22] Filed: Aug. 15, 1973

[21] Appl. No.: 388,519

[52] U.S. Cl. .................................. 330/107, 330/109

[51] Int. Cl. .................................................. H03f 1/36

[58] Field of Search ............... 330/21, 31, 107, 109; 328/167

[56] References Cited

OTHER PUBLICATIONS

Holbrook, "The Engineer's Stereo Preamp," Electronics World, May, 1968, pp. 44, 45.

*Primary Examiner*—Herman Karl Saalbach
*Assistant Examiner*—James B. Mullins
*Attorney, Agent, or Firm*—J. M. Arnold

[57] ABSTRACT

An amplifier in which the feedback impedance includes a four terminal capacitor, and in which the input impedance is connected to a source of operating potential. The use of a four terminal capacitor as a feedback element compensates for the failure mode of the amplifier in which the opening of the feedback element results in infinite AC gain of the amplifier. The connection of the signal input impedance to a source of operating potential compensates for the failure mode of the amplifier in which the input impedance shorts, which normally results in infinite AC gain of the amplifier.

4 Claims, 2 Drawing Figures

AMPLIFIER WITH FAILSAFE PREDERTERMINED GAIN

BACKGROUND OF THE INVENTION

In a number of control systems, for example vehicle control systems there is a need for elements such as amplifiers which are failsafe in their operation. One of the main considerations in the design of an amplifier for such a system is that the amplifier has a failsafe predetermined gain.

According to the present invention a failsafe amplifier is disclosed which is relatively inexpensive and easy to design as compared with prior art failsafe amplifiers which use expensive transformers or the like in their design.

SUMMARY OF THE INVENTION

According to the present invention an amplifier circuit is disclosed which has failsafe predetermined gain and which includes a circuit input terminal, a circuit output terminal, and a source of operating potential. An amplifier having first and second input terminals and an output terminal, has the first input terminal connected to the circuit input terminal. A four terminal capacitor has the first terminal therof connected to the output terminal of the amplifier, the second terminal of the capacitor connected to the second input terminal of the amplifier, and the third terminal of the capacitor connected to the circuit output terminal. A first impedance means is included which is connected between the fourth terminal of the capacitor and the source of operating potential.

DESCRIPTION OF THE PREFERRED EMBODIMENT

Figure 1:
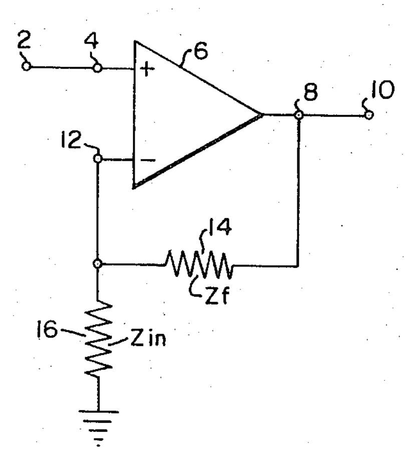
PRIOR ART FIG. 1
FIG. 1 is a schematic diagram representation of an operational amplifier as known in the prior art.

An operational amplifier according to the prior art is illustrated in FIG. 1. A circuit input terminal 2 is connected to a first input terminal 4 of an amplifier 6. The output terminal 8 of the amplifier is connected to a circuit output terminal 10, and to a second input terminal 12 of the amplifier 6 by way of a feedback impedance 14. The terminal 12 is connected to circuit ground by way of an input impedance 16. The AC gain of the operational amplifier is described by the following equation:

$$G = 1 + (Zf/Zin)$$

In the equation above *Zf* is the feedback impedance 14 of the amplifier, and *Zin* is the input impedance 16 of the amplifier. For such an amplifier to have a failsafe predetermined gain it is necessary that the gain of the circuit doesn't increase above a fixed value under normal or plausible failure modes of the feedback and input impedances of the network.

For purposes of description, the amplifier is considered to have a failsafe predetermined gain when the gain of the amplifier is not allowed to approach infinity during any failure mode. If the gain of the amplifier approaches unity (1) or the amplifier goes into direct current (DC) saturation during a failure mode, these are considered safe failure modes. The failure modes of the feedback and input impedances of the network therefore require analysis. The two failure modes of ZF are that the impedance shorts of the impedance opens. If Zf shorts, that is the impedance of the element equals zero, it is seen that the gain of the amplifier approaches 1 which is a safe failure mode. If, however, Zf opens, that is its impedance approaches infinity, the gain of the amplifier also approaches infinity which clearly is an unsafe operational condition.

The failure modes of the circuit input impedance Zin are that the impedance opens or shorts. If Zin opens, that is its impedance approaches infinity, it is seen that the gain of the network equals 1 which is clearly a safe failure mode. If, however, Zin shorts, that is its impedance approaches zero, the gain of the amplifier approaches infinity which clearly is an unsafe operational condition.

It is seen, therefore, that for the circuit of FIG. 1 to have a failsafe predetermined gain it is necessary that Zf is an element that under no circumstances is allowed to open, or at least the opening of the element is compensated for. Also it is seen that Zin must be an element which doesn't short out or alternatively there are means included which compensate for the shorting out of the element.

Figure 2:
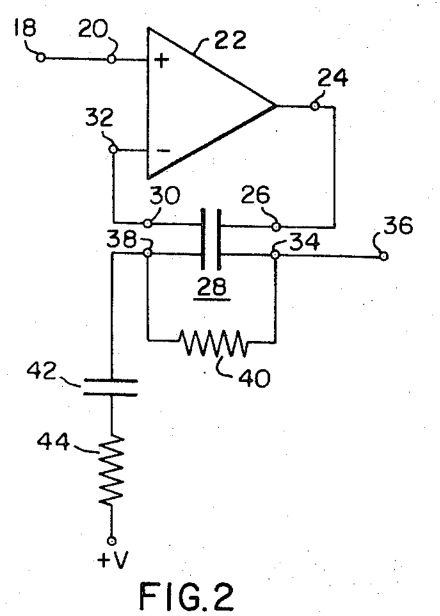
FIG. 2 is a schematic diagram representation of an amplifier according to the present invention.

In reference to FIG. 2 there is illustrated an amplifier having failsafe predetermined gain in which the feedback element is the type which doesn't open, or at least the opening of such element is compensated for, and the input impedance is an element which doesn't short or alternatively the shorting of which is at least compensated for. A circuit input terminal 18 is connected to a first input terminal 20 of an amplifier 22 which has its output terminal 24 connected to a first input terminal 26 of a four terminal capacitor 28. A second terminal 30 of the capacitor is connected to a second input terminal 32 of the amplifier 22. A third terminal 34 of the capacitor 28 is connected to a circuit output terminal 36 and to the fourth terminal 38 of the capacitor 28 by way of a DC bias resistor 40. The terminal 38 of the capacitor 28 is connected to a source of operating potential +V by way of the series connection of a capacitor 42 and a resistor 44.

The gain of the circuit of FIG. 2 is also represented by the equation:

$$G = 1 + (Zf/Zin)$$

For the circuit of FIG. 2 Zf is represented by the following equations:

$$Zf = [(Rf)\ 1/SCf]/(Rf + 1/SCf)$$

In the above equation *Rf* is the resistor 40, *Cf* is the capacitor 28, and *S* is the Lapalce transform operator. If Rf is chosen to have an impedance very very much larger than the impedance 1/SCf than the feedback impedance may be represented by the equation:

$$Zf = 1/Scf$$

The input impedance of the circuit is represented by the following equation:

$$Zin = Rin + 1/Scin$$

In the above equation *Rin* is the resistor 44, *Cin* is the capacitor 42, and *S* is the Lapalce transform operator. If the impedance 1/SCin is chosen to have a value very very much larger than the impedance Rin then the input impedance may be represented by the following equation:

$$Zin = 1/Scin$$

The equation for the gain of the circuit is then represented by:

$$G = 1 + [(1/SCf)/(1/SCin)]$$

The failure modes of the circuit will now be analyzed according to the equation above. Before this analysis is undertaken, however, failure modes of the resistors 40 and 44 will be considered to show that the choice of their respective impedance values and any failures of these elements will not effect the gain of the amplifier in an unsafe manner. First consider the failure modes of the resistor 40, that is the resistor Rf. If Rf were to open there would be substantially no effect on the gain of the network since Rf was chosen to originally have an impedance very very much larger than the impedance 1/SCf. If Rf were to short, this would short out the impedance 1/SCf, and the gain of the amplifier would be 1 which clearly is a safe condition. If the resistor 44, that is the resistor Rin, were to short this would essentially have no effect on the gain of the network since the impedance 1/SCin was chosen to have an impedance value very very much larger than the impedance of the resistor Rin. If the resistor Rin were to open, the input impedance Zin would approach infinity which would cause the gain to approach 1 which again is a safe condition.

The gain equation above will now be analyzed for the failure modes of Cf and Cin. As is known, a shorted capacitor has an infinite capacitance and in turn zero impedance. Conversely, an open capacitor has zero capacitance and in turn infinite impedance. Presently, high reliability capacitors are avilable in the market place which capacitors have very very low failure rates. That is, the chances of these capacitors shorting or opening are negligible. Such capacitors, for example, may be of mylar or glass insulated construction. In the latter type capacitor, there is a fused monolithic construction of proven glass dielectric and conductive elements which provide outstanding preformance in stability and reliability. Accordingly, the use of such capacitors is recommended in the practice of the present invention. If follows therefore that if Cin is open its impedance is infinite which results in the gain of the amplifier being equal to 1 which is clearly a safe condition. As was stated above, if a capacitor is made of mylar or of insulated glass construction or the like the chance of the capacitor shorting is slim, however, in the event Cin should short there must be a means of compensating such that the gain of the amplifier does not approach infinity which is the case when Cin shorts. This condition is compensated for due to Cin being coupled to the reference voltage +V by way of resistor 44. For if Cin shorts the voltage +V B is coupled directly to the amplifier input terminal 32 such that the amplifier is driven into DC saturation and as such is not responsive to any AC signal input. It is seen therefore that the amplifier is not driven to approach an infinite gain due to any failure of Cin or Rin as was described above.

If Cf were to short the impedance would equal zero in the feedback network, and as a result the gain of the amplifier would equal 1 which is clearly a safe condition of operation. On the other hand, if Cf were to open the gain of the amplifier would approach infinity which is clearly an unsafe condition. As was stated above the capacitor is so constructed that the chances of its physically opening are slim. The most plausible open failure condition that may exist is one of the wires connected to the four terminals of the capacitor breaking thus causing an open circuit condition in the feedback path. If the wire connected to terminal 26 or 34 were to break the feedback path would become open and as a result the amplifier 22 would exhibit infinite gain as manifested at the output terminal 24 of the amplifier. Since, however, there is an open condition at either the terminal 26 or 34 there would be no signal manifested at circuit output terminal 36, and as a result this would be a safe operational condition since the load network (not shown) connected to the terminal 36 would no longer receive an input signal. If the lead connected to the terminal 30 were to break there is no DC bias, and the amplifier would go into DC saturation and therefore would be non-responsive to AC signal inputs which is a safe condition. If the wire connected to the terminal 38 were to break this would be the same type condition as if an element in the impedance input network were to open and the gain of the amplifier would go to 1 which clearly is a safe condition.

From the analysis above it is seen that the disclosed amplifier has a failsafe predetermined gain in that the failure of any component in the input or feedback network results in the amplifier going into DC saturation, unity gain, or alternaltively no signal is applied to the circuit output terminal.

I claim as my invention:

1. In an amplifier circuit having failsafe predetermined gain, the combination comprising:
- a circuit input terminal;
- a circuit output terminal;
- a source of operating potential;
- an amplifier having first and second input terminals and an output terminal, with the first input terminal being connected to said circuit input terminal;
- a capacitor having first, second, third and fourth terminals, with the first terminal being connected to the output terminal of said amplifier, the second terminal being connected to the second input terminal of said amplifier, and the third terminal being connected to said circuit output terminal; and
- a first impedance means connected between the fourth terminal of said four terminal capacitor and said source of operating potential.

2. The combination claimed in claim 1 including:
- a second impedance means connected between the third and fourth terminals of said four terminal capacitor.

3. The combination claimed in claim 2 wherein said first impedance means comprises a first resistor connected in series with a capacitor, and said second impedance means comprises a second resistor.

4. In a failsafe amplifier circuit in which the alternating current gain does not exceed a predetermined level irrespective of any failure mode, the combination comprising:
- a circuit input terminal;
- a circuit output terminal;
- a source of operating potential;
- an amplifier having a first input terminal connected to said circuit input terminal and also having a second input terminal and an output terminal;

a four terminal capacitor having the first terminal thereof connected to the output terminal of said amplifier and the second terminal thereof connected to the second input terminal of said amplifier and the third terminal thereof connected to said circuit output terminal;

a first resistor connected between the third and fourth terminals of said four terminal capacitor;

a two terminal capacitor having one terminal thereof connected to the fourth terminal of said four terminal capacitor; and a second resistor connected between the remaining terminal of said two terminal capacitor and said source of operating potential.

* * * * *